United States Patent
Ho et al.

(10) Patent No.: US 6,707,162 B1
(45) Date of Patent: Mar. 16, 2004

(54) CHIP PACKAGE STRUCTURE

(75) Inventors: Kwun-Yao Ho, Taipei Hsien (TW); Moriss Kung, Taipei Hsien (TW)

(73) Assignee: Via Technologies, Inc., Taipei Hsien (TW)

( * ) Notice: Subject to any disclaimer, the term of this patent is extended or adjusted under 35 U.S.C. 154(b) by 0 days.

(21) Appl. No.: 10/248,468

(22) Filed: Jan. 22, 2003

(30) Foreign Application Priority Data

Oct. 25, 2002 (TW) ........................................ 91217162 U

(51) Int. Cl.⁷ .......................... H01L 23/48; H01L 23/31
(52) U.S. Cl. ...................... 257/778; 257/737; 174/258; 174/260
(58) Field of Search .............................. 174/256, 258, 174/260; 257/723, 737, 738, 778; 438/108, 125, 126, 127

(56) References Cited

U.S. PATENT DOCUMENTS 6,118,179 A * 9/2000 Farnworth et al. .......... 257/734
6,229,711 B1 * 5/2001 Yoneda ....................... 361/760
6,259,608 B1 * 7/2001 Berardinelli et al. ........ 361/777
6,281,450 B1 * 8/2001 Urasaki et al. ............. 174/261

\* cited by examiner

*Primary Examiner*—John B. Vigushin
(74) *Attorney, Agent, or Firm*—Jiang Chyun IP Office

(57) ABSTRACT

A chip package structure comprising a chip and a substrate is provided. The chip has an active surface, a plurality of chip pads and a plurality of bonding columns. The chip pads are formed on the active surface, and the bonding columns are bonded to their respective chip pads. The substrate has a substrate surface, a solder mask layer, a plurality of junction pads and a plurality of trace lines. The substrate surface is divided into a chip junction region and a non-chip junction region. The junction pads and a portion of the trace lines are formed within the chip junction region on the substrate surface while the remaining trace lines are formed within the non-chip junction region on the substrate surface. The end of each bonding column is bonded to a corresponding junction pad. The chip package structure may further include an underfill layer that completely fills the space within the chip, the bonding columns and the substrate.

19 Claims, 4 Drawing Sheets

CHIP PACKAGE STRUCTURE

CROSS REFERENCE TO RELATED APPLICATIONS

This application claims the priority benefit of Taiwan application serial no. 91217162, filed on Oct. 25, 2002.

BACKGROUND OF INVENTION

1 Field of Invention

The present invention relates to a chip package structure. More particularly, the present invention relates to a flip chip package structure having bonding columns instead of bumps as connective medium between an internal chip and an internal substrate.

2 Description of Related Art

Flip chip bonding technology is one of the principle techniques for forming a chip package. To form a flip chip package, bumps are formed on chip pads arranged as an array on the active surface of a chip. Next, the chip is flipped over so that the bumps are electrically and physically connected to corresponding bonding pads on a carrier (for example, a substrate or a printed circuit board (PCB)). Note that flip chip technique is able to produce a package having a higher pin count and occupying a smaller area. Moreover, average length of signal transmission paths is reduced considerably.

FIGS. 1A and 1B are schematic cross-sectional views showing the structure before and after the assembling of a chip and a substrate to form a first type of conventional flip-chip package. First, as shown in FIG. 1A, the chip package structure 100 mainly includes a chip 110 and a substrate 120. The chip 110 has an active surface 112, a plurality of chip pads 116, a passivation layer 114 and a plurality of bumps 118. The active surface 112 of the chip 110 refers to the side of the chip 110 where most of the active devices are formed. The chip pads 116 are positioned on the active surface 112 of the chip 110. The passivation layer 114 covers the active surface 112 of the chip 110 but exposes the chip pads 116. The bumps 118 having a hemispherical profile are formed over the chip pads 116. An under-bump-metallurgy (UBM) layer may also be formed between the chip pads 116 and the bump 118 to increase the bonding strength between the chip pads 116 and the bump 118. In addition, the substrate 120 further includes a substrate surface 122, a patterned circuit layer 124 and a solder mask layer 126. The circuit layer 124 is located on the substrate surface 122 of the substrate 120. The circuit layer 124 is a system comprising of a plurality of junction pads 124a and a plurality of trace lines 124b. The solder mask layer 126 is also located on the substrate surface 122 of the substrate 120 covering the circuit layer 124. The solder mask layer 126 has a plurality of openings 126a that exposes the junction pads 124a. Hence, the flip chip 110 is able to attach to the substrate 120 through the bumps 118. An underfill material is also injected into the space between the chip 110 and the substrate 120 to form an underfill layer 130. The underfill layer 130 protects the chip pads 116, the bumps 118 and the junction pads 124a.

Note that the junction pads 124a in FIG. 1A are solder mask defined (SMD) junction pads. Hence, the exposed area of the junction pads 124a is defined by the opening 126a in the solder mask layer 126. Furthermore, the circuit layer 124 is normally fabricated using copper. To prevent surface oxidation of the junction pad 124a and increase bonding strength between the bump 118 and the junction pad 124a, stencil printing is often used to form a pre-solder block 128 inside the opening 126a.

FIGS. 2A and 2B are schematic cross-sectional views showing the structure before and after the assembling of a chip and a substrate to form a second type of conventional flip-chip package. As shown in FIG. 2A, the chip package 102 is similar to the chip package structure 100 in FIG. 1A. The only difference between the two is in the junction pad portion of the substrate. In FIG. 2A, the junction pad 124a is a non-solder mask defined (NSMD) junction pad. The exposed area of the junction pad 124a is not defined by the opening 126a in the solder mask layer 126. Because the circuit layer 124 is generally made using copper, a plating process is carried out to form a metallic layer 129 over the junction pad 124a to prevent surface oxidation of the junction pad 124a and increase the bonding strength between the bump 118 and the junction pad 124a. The metallic layer 129 can be a composite metallic layer such as a nickel/gold composite layer.

In general, an underfill dispense process is also required in the fabrication a conventional flip chip package. Here, capillary effect is utilized to carry underfill material into the space between the chip and the substrate before the underfill material solidifies into an underfill layer. The underfill material not only isolates various bumps electrically, but also buffers the bumps against lateral breakage due to thermal stress between the chip and the substrate produced by countless heating/cooling cycles. Note that voids are easily formed when the underfill material flows into the space between the chip and the substrate. Because voids are often the center of stress concentration and the residual gases inside these voids may expand when heated, reliability of the chip package is frequently reduced. Moreover, when the density of bumps between the chip and the substrate is high or the separation between the chip and the substrate is too small, underfill material may have difficulty getting into the space leading to considerable increase in void size and void density.

SUMMARY OF INVENTION

Accordingly, one object of the present invention is to provide a chip package structure suitable for forming a flip chip package that eliminates the need for conducting an underfill dispensing process and hence lowering the probability of producing voids in the space between an internalized chip and an internalized substrate. Furthermore, even if the density of bumps on the chip is high, underfill material is still able to fill up all the gaps between the bumps, the chip and the substrate.

To achieve these and other advantages and in accordance with the purpose of the invention, as embodied and broadly described herein, the invention provides a chip package structure. The chip package structure at least includes a chip, a substrate and an underfill layer. First, a chip having an active surface with a plurality of chip pads and a plurality of bonding columns thereon is provided. The chip pads are positioned on the active surface of the chip. Each bonding column is connected to a corresponding chip pad. The substrate has a substrate surface, a solder mask layer, a plurality of junction pads and a plurality of trace lines. The substrate surface includes a chip junction region and a non-chip junction region. The junction pad and a portion of the trace lines are positioned within the chip junction region of the substrate surface. The remaining trace lines are positioned within the non-chip junction region of the substrate surface. Each bonding column is connected to a corresponding junction pad. In addition, the chip package structure further includes an underfill layer filling up the space bounded by the chip, the bonding columns and the substrate.

According to the chip package structure of this invention, the substrate may further include a patterned circuit layer on the substrate surface that forms the aforementioned junction pads and trace lines.

According to the chip package structure of this invention, the bonding column may further include a metallic layer positioned between each bonding column and its corresponding junction pad. The metallic layer can be a single metallic layer or a composite metallic layer having a plurality of metallic layers and the metallic layer can be fabricated using a single metallic element, an alloy or a combination of the two.

According to the chip package structure of this invention, the chip may further include a passivation layer covering the active surface of the chip but without completely covering the chip pads. The underfill layer is formed over the passivation layer.

According to the chip package structure of this invention, the chip may further include a plurality of under-bump-metallurgy layers between the chip pads and their corresponding bonding column.

According to the chip package structure of this invention, the chip pads and the bonding columns may be fabricated using an identical material.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

Figure 1A:
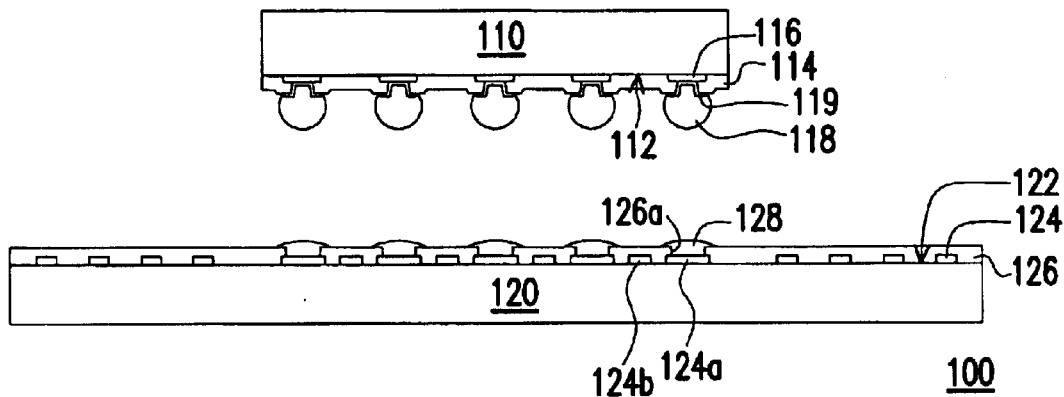
FIGS. 1A and 1B are schematic cross-sectional views showing the structure before and after the assembling of a chip and a substrate to form a first type of conventional flip-chip package.
Figure 1B:
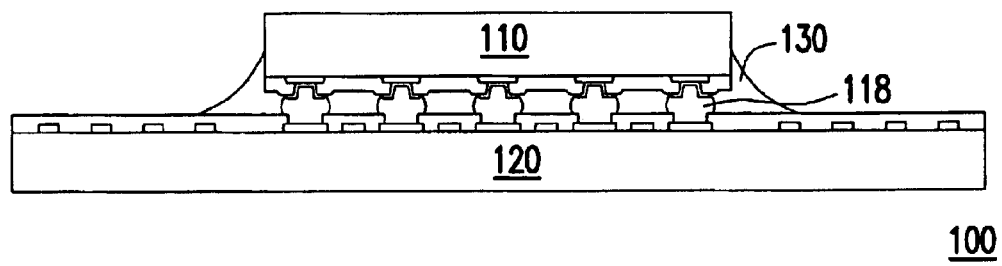
Figure 2A:
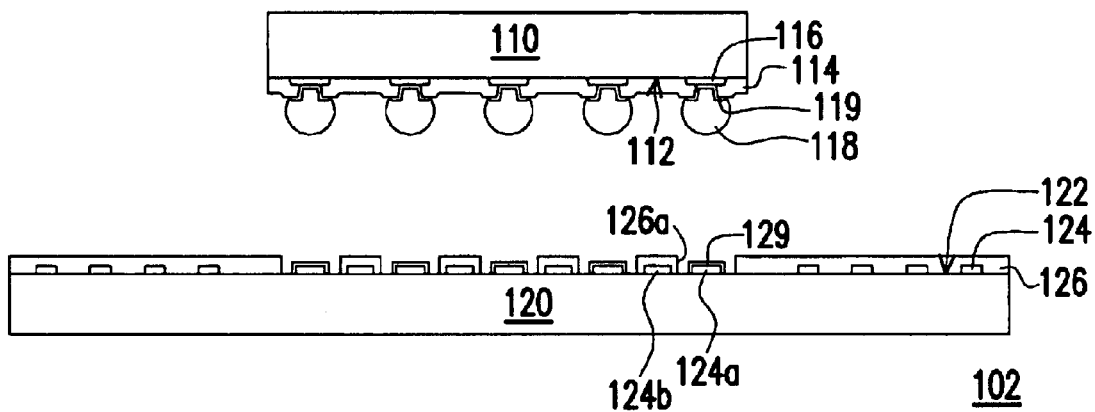
FIGS. 2A and 2B are schematic cross-sectional views showing the structure before and after the assembling of a chip and a substrate to form a second type of conventional flip-chip package.
Figure 2B:
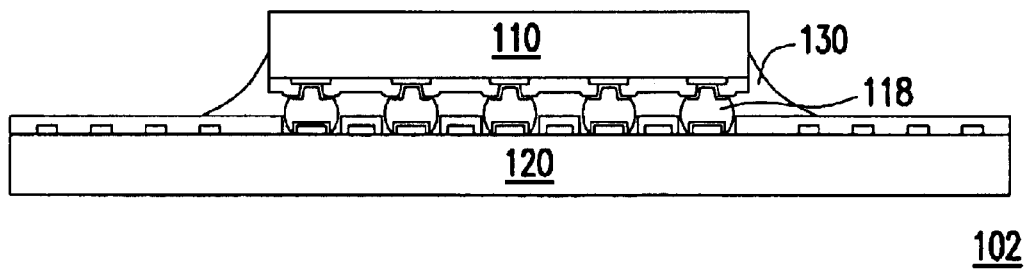

Reference will now be made in detail to the present preferred embodiments of the invention, examples of which are illustrated in the accompanying drawings. Wherever possible, the same reference numbers are used in the drawings and the description to refer to the same or like parts.

Figure 3A:
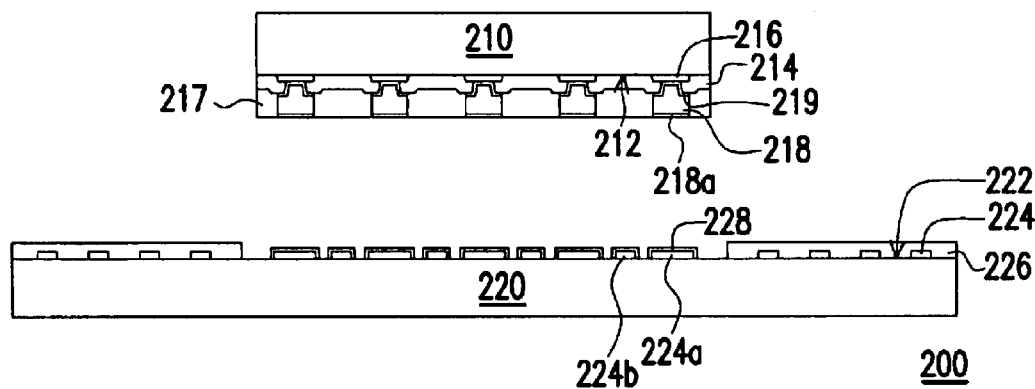
FIGS. 3A and 3B are schematic cross-sectional views showing the structure before and after the assembling of a chip and a substrate to form a flip-chip package according to one preferred embodiment of this invention.
Figure 3B:
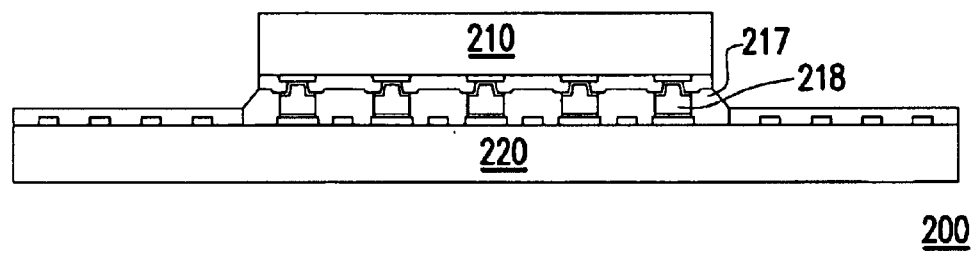

FIGS. 3A and 3B are schematic cross-sectional views showing the structure before and after the assembling of a chip and a substrate to form a flip-chip package according to one preferred embodiment of this invention. As shown in FIG. 3A, the chip package structure 200 mainly includes a chip 210 and a substrate 220. The chip 210 further includes an active surface 212, a passivation layer 214, a plurality of chip pads 216, an underfill layer 217 and a plurality of bonding columns 218. The active surface 212 of the chip 210 refers to the side of the chip 210 where most of the active devices are located. The chip pads 216 are located on the active surface 212 of the chip 210. The passivation layer 214 covers the active surface 212 of the chip 210 but without completely covering the entire surface of the chip pads 216. The passivation layer 214 serves mainly as a protective layer preventing any agent used in other processes from damaging the chip 210 via the active surface 212. Aside from a single layer, the passivation layer 214 can be a composite layer with special properties to cushion the bonding columns 218 against stress.

The underfill layer 217 is formed over the passivation layer 214. The underfill layer is fabricated using a thermal cure or thermal plastic material. The bonding columns 218 pass through the underfill layer 217 and connect with a corresponding chip pad 216. The bonding columns 218 are fabricated using a conductive material such as a single metallic element or an alloy of metals. In addition, the bonding columns 218 may comprise of just a single metallic layer or a stack of metallic layers (not shown). The chip 210 may further include a plurality of under-bump-metallurgy layers 219. Each under-bump-metallurgy layer 219 is positioned between the chip pad 216 and its corresponding bonding column 218 to increase the bonding strength between the chip pad 216 and the bonding column 218. Note that the bonding columns 218 and the chip pads 216 may be fabricated using an identical material so that a uniform bonding strength between the two is obtained. Furthermore, because each chip pad 216 is stacked on top of an electrode pad (not shown) along an interconnect (not shown) inside the chip 210, the chip pad 216 and the bonding column 218 may form directly over the electrode pad without forming an intermediate under-bump-metallurgy layer 219. Hence, the bottom section of the bonding column 218 actually replaces the chip pad 216. Thereafter, the passivation layer 214 is formed over the active surface 212 of the chip 210 such that the passivation layer 214 exposes the bonding columns 218.

Figure 4:
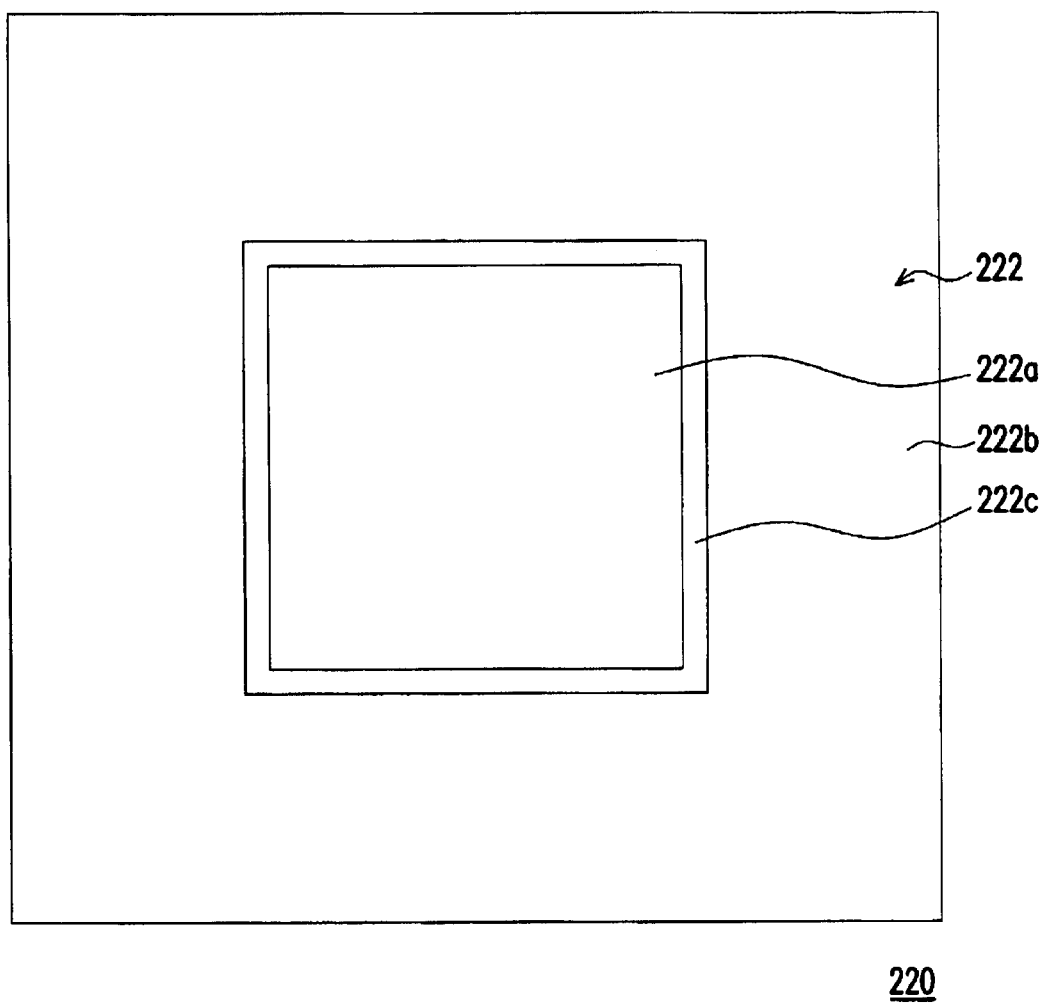
FIG. 4 is a top view showing the substrate surface of a substrate according to the preferred embodiment of this invention.

FIG. 4 is a top view showing the substrate surface of a substrate according to the preferred embodiment of this invention. In FIG. 3A, the substrate 220 further includes a substrate surface 222 and a patterned circuit layer 224. As shown in FIG. 4, the substrate surface 222 is partitioned into a chip junction region 222a and a non-chip junction region 222b. The circuit layer 224 comprising a plurality of junction pads 224a and a plurality of trace lines is formed on the substrate surface 222 of the substrate 220. The junction pads 224a and a portion of the trace lines 224b are located within the chip junction region 222a of the substrate surface 222 while the remaining trace lines 224b are located within the non-chip junction region 222b. In addition, the substrate 220 further includes a solder mask layer 226 on the non-chip junction region 222b of the substrate surface 222. Hence, a portion of the trace lines 224b of the circuit layer 224 is covered while the junction pads 224a and the trace lines 224b within the chip junction region 222a are exposed. Note that the circuit layer 224 is normally made of copper. Hence, the surface of the circuit layer 224 can be easily oxidized leading to a weakening of the bond between the bonding column 218 and the junction pad 224a. To prevent surface oxidation of the exposed junction pads 224a and the trace lines 224b, an additional isolation layer 228 is formed over the substrate 220 before assembling the chip 210 and the substrate 220 together. The isolation layer 228 covers the junction pads 224a and a portion of the trace lines 224b outside the solder mask layer 226 and prevents the junction pads 224a and a portion of the trace lines 224b from contacting oxygen. However, the isolation layer 228 must be totally evaporated away during a thermal processing operation (at a temperature between 210° C. to 220° C.) for binding the chip 210 and the substrate 220 together. After removing the isolation layer 228, the junction pads 224a are exposed so that each bonding column 218 is able to join up with a corresponding junction pad 224a. The isolation layer 228 is an organic compound such as an organic surface passivation (OSP) layer formed, for example, by coating or dipping.

As shown in FIG. 3A, the process of joining the chip 210 and the substrate 220 together may includes heating the isolation layer 228 such that the isolation layer 228 evaporates to expose the junction pads 224a. Thereafter, a thermal press bonding or some other bonding process may be used to join each bonding column 218 with a corresponding junction pad 224a as shown in FIG. 3B. To increase the bonding strength between the bonding column 218 and the junction pad 224a, a metallic layer 218a is optionally formed over the upper surface of the bonding column. The metallic layer 218a can be a single metallic layer or a composite metallic layer. Moreover, the metallic layer 218a can be fabricated using a single metallic element, an alloy of metals or a combination of the two. In general, the underfill layer 217 as shown in FIG. 3B is made from a thermal cure or thermal plastic material such as thermal set plastic, thermal set resin or multi-stage cure resin. Hence, the underfill layer 217 will fill up the space bounded by the chip 210, the substrate 220 and the bonding columns 218 when heated. As the underfill layer 217 cools down and solidifies, a complete chip package 200 is formed.

As shown in FIG. 4 the substrate surface 222 has an alignment region 222c between the chip junction region 222a and the non-chip junction region 222b. The alignment region 222c prevents the edges of the underfill layer 217 from latching to the edges of the solder mask layer 226 when the chip 210 is positioned over the substrate 220. This smoothes the lowering of the bonding columns 218 onto their respective junction pads 224a. After the underfill layer 217 is thermally set, the gap between the chip 210, the bonding columns 218 and the substrate 220 are solidly filled with underfill material as shown in FIG. 3B.

In summary, major advantages of the chip package structure according to this invention include:

1. Since the solder mask layer exposes all of the junction pads and a portion of the trace lines, the bottom section of the underfill layer bonds directly with the circuit layer in the substrate and the dielectric layer underneath. Moreover, the bonding strength between the underfill layer and the dielectric layer is even stronger than the bonding strength between the underfill layer and the solder mask layer. Ultimately, mechanical strength of the chip package is increased.

2. Since the openings in the solder mask layer already expose the junction pads completely and the trace lines partially, there is no need to form a plurality of fine pitch opening in a solder mask layer using ultra-precise processing station to expose the junction pads. Hence, production cost of the substrate within the chip package is reduced.

3. An isolation layer covering the exposed junction pads and a portion of the trace lines is used to prevent surface oxidation. Hence, there is no need to form a presolder block or a nickel-gold composite layer over the junction pads.

4. No underfill dispensing process is required in this invention. Instead, an underfill layer is formed over the active surface of the chip such that the bonding columns pass through the underfill layer to join up with respective chip pads or directly with electrode pads along a metallic interconnect. This arrangement prevents the formation of voids inside the underfill layer and increases the working life and reliability of the package.

5. Because the chip package is fabricated by forming bonding columns over the chip and depositing underfill material around the gap between bonding columns instead of injecting underfill material into the gap between the chip and the substrate afterwards, density of the bonding columns (or chip pads) is increased. Furthermore, there is no need to worry about the formation of voids inside the underfill layer. Thus, the invention can be applied to form any chip packages with a dense core of chip pads (or electrode pads).

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A chip package structure, at least comprising:

at least one chip having an active surface, a plurality of chip pads and a plurality of bonding columns, wherein the chip pads are located on the active surface of the chip and the bonding columns are connected to their corresponding chip pads, respectively; and a substrate having a substrate surface, a plurality of junction pads, a plurality of trace lines and a solder mask layer, wherein the substrate surface includes a chip junction region and a non-chip junction region, the junction pads and a portion of the trace lines are located within the chip junction region on the substrate surface and the remaining trace lines are located within the non-chip junction region on the substrate surface, the solder mask layer covers the non-chip junction region for protecting the trace lines within the non-chip junction region, and the bonding columns are directly connected to the corresponding junction pads without any connection medium between them, respectively; and an underfill layer that completely fills the space within the chip, the bonding columns and the substrate.

2. The chip package structure of claim 1, wherein material forming the underfill layer is selected from a group consisting of thermal set and thermoplastic material.

3. The chip package structure of claim 1, wherein the underfill layer is formed on the active surface of the chip so that the underfill material fills up the space within the chip, the bonding columns and the substrate when the underfill layer is heated and consolidates to a solid mass again when the underfill material cools down.

4. The chip package structure of claim 1, wherein the substrate further includes a patterned circuit layer positioned on the substrate surface to constitute the junction pads and the trace lines.

5. The chip package structure of claim 1, wherein each bonding column further includes a metallic layer between the bonding column and a corresponding junction pad, and the metallic layer is either a single or a composite metallic layer.

6. The chip package structure of claim 5, wherein material constituting the metallic layer is selected from a group consisting of an elemental metal, an alloy of metals and some combination of the two.

7. The chip package structure of claim 1, wherein the chip further includes a passivation layer located on the active surface of the chip such that the passivation only covers the chip pad partially and that the underfill layer is formed over the passivation layer.

8. The chip package structure of claim 1, wherein the chip further includes a plurality of under-bump-metallurgy layers between the respective chip pads and corresponding bonding columns.

9. The chip package structure of claim 1, wherein the chip pads and the bonding columns are fabricated using the same material.

10. A substrate structure, at least comprising:
   a substrate having a substrate surface, wherein the substrate surface includes a chip junction region and a non-chip junction region;
   a patterned circuit layer on the substrate surface, wherein the circuit layer constitutes a plurality of junction pads and a plurality of trace lines, the junction pads and a portion of the trace lines are located within the chip junction region on the substrate surface, and the remaining trace lines are located within the non-chip junction region on the substrate surface;
   a solder mask layer covering the non-chip junction region of the substrate surface for protecting the trace lines on the substrate surface within the non-chip junction region; and
   an isolation layer covering the junction pads and a portion of the trace lines not covered by the solder mask layer.

11. The substrate structure of claim 10, wherein the isolation layer includes an organic surface preservation layer.

12. A chip package structure, at least comprising:
   at least one chip having an active surface, a plurality of chip pads and a plurality of bonding columns, wherein the chip pads are located on the active surface of the chip and the bonding columns are connected to their corresponding chip pads, respectively;
   a substrate having a substrate surface, a plurality of junction pads, a plurality of trace lines and a solder mask layer, wherein the substrate surface includes a chip junction region and a non-chip junction region, the junction pads and a portion of the trace lines are located within the chip junction region on the substrate surface and the remaining trace lines are located within the non-chip junction region on the substrate surface, the solder mask layer covers the non-chip junction region for protecting the trace lines within the non-chip junction region, and the bonding columns are connected to the corresponding junction pads, respectively; and
   an underfill layer that completely fills the space within the chip, the bonding columns and the substrate, wherein the underfill layer is formed on the active surface of the chip so that the underfill material fills up the space within the chip, the bonding columns and the substrate when the underfill layer is heated and consolidates to a solid mass again when the underfill material cools down.

13. The chip package structure of claim 12, wherein material forming the underfill layer is selected from a group consisting of thermal set and thermoplastic material.

14. The chip package structure of claim 12, wherein the substrate further includes a patterned circuit layer positioned on the substrate surface to constitute the junction pads and the trace lines.

15. The chip package structure of claim 12, wherein each bonding column further includes a metallic layer between the bonding column and a corresponding junction pad, and the metallic layer is either a single or a composite metallic layer.

16. The chip package structure of claim 15, wherein material constituting the metallic layer is selected from a group consisting of an elemental metal, an alloy of metals and some combination of the two.

17. The chip package structure of claim 12, wherein the chip further includes a passivation layer located on the active surface of the chip such that the passivation only covers the chip pad partially and that the underfill layer is formed over the passivation layer.

18. The chip package structure of claim 12, wherein the chip further includes a plurality of under-bump-metallurgy layers between the respective chip pads and corresponding bonding columns.

19. The chip package structure of claim 12, wherein the chip pads and the bonding columns are fabricated using the same material.

* * * * *